(12) United States Patent
Nishioka et al.

(10) Patent No.: US 8,462,499 B2
(45) Date of Patent: Jun. 11, 2013

(54) INFORMATION PROCESSING APPARATUS

(75) Inventors: Hisaya Nishioka, Hamaru (JP);
Masayuki Sanada, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 260 days.

(21) Appl. No.: 12/957,219

(22) Filed: Nov. 30, 2010

(65) Prior Publication Data

US 2011/0128698 A1 Jun. 2, 2011

(30) Foreign Application Priority Data

Nov. 30, 2009 (JP) ................. 2009-272772

(51) Int. Cl.
*H05K 7/20* (2006.01)
(52) U.S. Cl.
USPC ............................. 361/688; 174/548; 62/3.7
(58) Field of Classification Search
USPC ............... 361/622–633, 676, 679.02, 679.46, 361/688, 715–722, 760, 781, 794, 803, 819, 361/831
See application file for complete search history.

(56) References Cited

U.S. PATENT DOCUMENTS

| | | | | |
|---|---|---|---|---|
| 6,445,580 | B1 * | 9/2002 | Cohen et al. | 361/679.47 |
| 6,499,306 | B2 * | 12/2002 | Gillen | 62/129 |
| 6,822,861 | B2 * | 11/2004 | Meir | 361/695 |
| 7,760,497 | B2 * | 7/2010 | Eddy et al. | 361/688 |
| 8,254,129 | B2 * | 8/2012 | Okutsu | 361/719 |
| 2005/0146850 | A1 * | 7/2005 | Meir | 361/687 |
| 2007/0097643 | A1 * | 5/2007 | Cheng | 361/700 |
| 2008/0232063 | A1 * | 9/2008 | Koo | 361/687 |
| 2010/0146991 | A1 * | 6/2010 | Ilercil et al. | 62/3.3 |

FOREIGN PATENT DOCUMENTS

| | | |
|---|---|---|
| JP | 2000-077585 A | 3/2000 |
| JP | 2001-015657 A | 1/2001 |
| JP | 2001-308571 A1 | 11/2001 |
| JP | 2003-256079 A1 | 9/2003 |
| JP | 2005-136212 A | 5/2005 |
| JP | 2005-340427 A1 | 12/2005 |

OTHER PUBLICATIONS

Notice of Reason for Rejection mailed by Japan Patent Office on Apr. 5, 2011 in the corresponding Japanese patent application No. 2009-272772.

* cited by examiner

*Primary Examiner* — Courtney Smith
(74) *Attorney, Agent, or Firm* — Knobbe Martens Olson & Bear LLP

(57) ABSTRACT

According to one embodiment, an information processing apparatus includes a cooling module configured to cool an electronic component, a thermoelectric element configured to absorb heat generated from the electronic component, and to generate first electricity by performing a thermoelectric conversion by use of the heat, a determination module configured to determine whether the supply source is a battery, and a switcher configured to switch between a first mode and a second mode, the thermoelectric element performing the thermoelectric conversion and the cooling module is driven by the first driving electricity generated from the first electricity in the first mode, and the thermoelectric element absorbing the heat and the cooling module is driven by the second driving electricity generated by use of second electricity from a supply source includes a battery in the second mode.

5 Claims, 6 Drawing Sheets

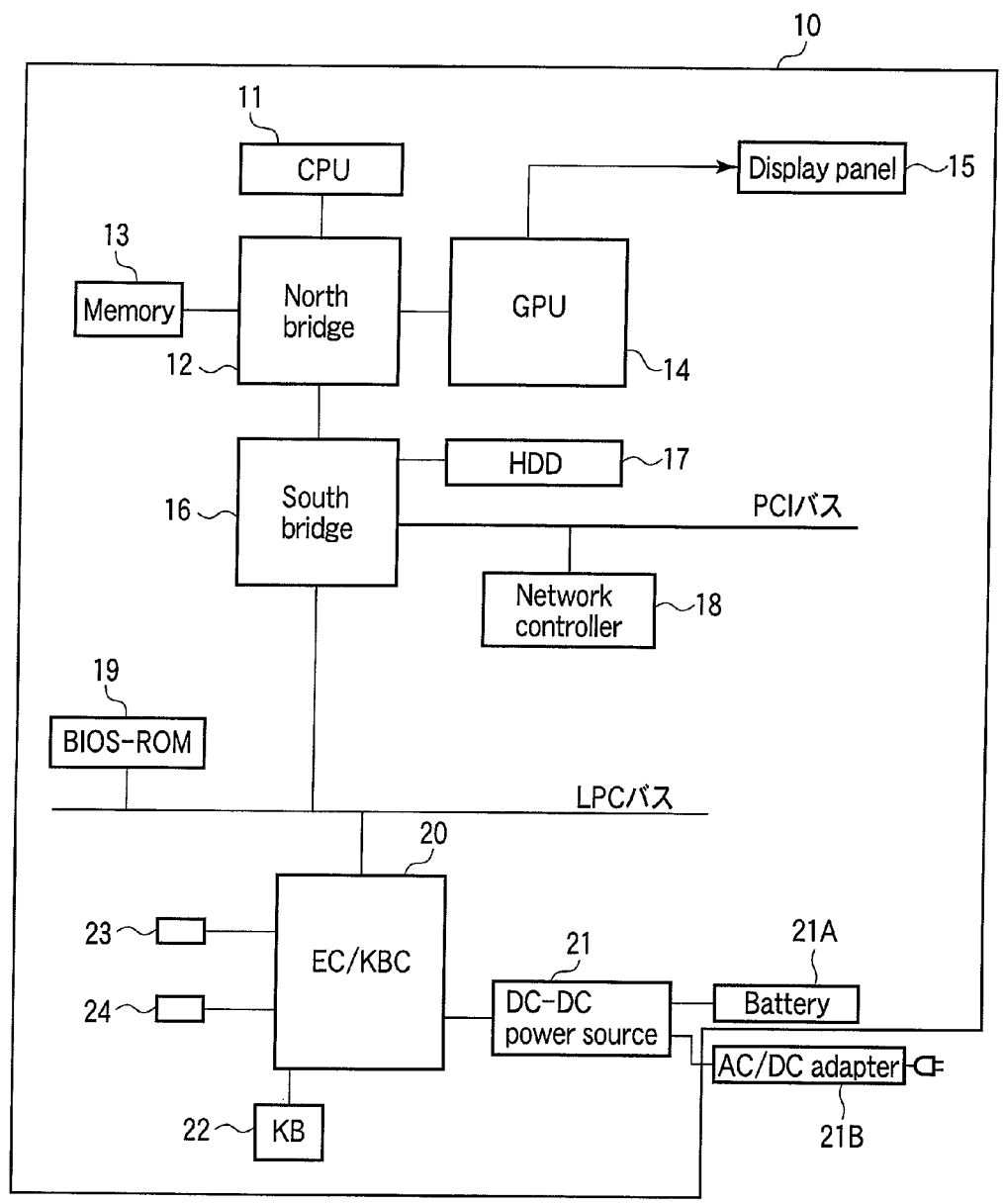
F I G. 1

|  | SW1 | SW2 | SW3 | Fan | Thermoelectric material | Driving electricity source |
|---|---|---|---|---|---|---|
| First mode | OFF | OFF | OFF | Non-driving | - | - |
| Second mode | ON | ON | OFF | Driving | Heat absorption | PSC |
| Third mode | OFF | OFF | ON | Driving | Thermoelectric conversion | LDO |
| Fourth mode | ON | OFF | ON | Driving | Thermoelectric conversion | PSC or DC-DC |
F I G. 4
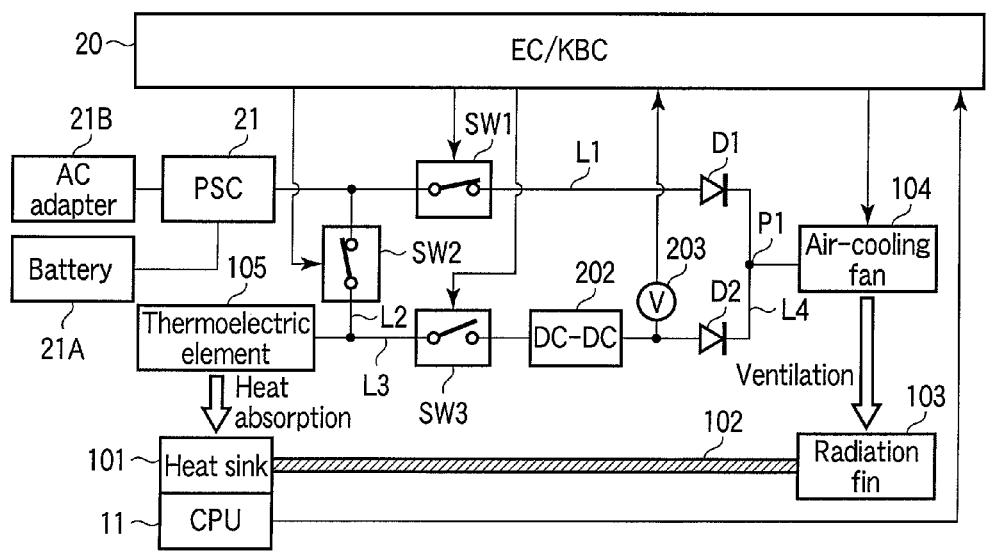
F I G. 5

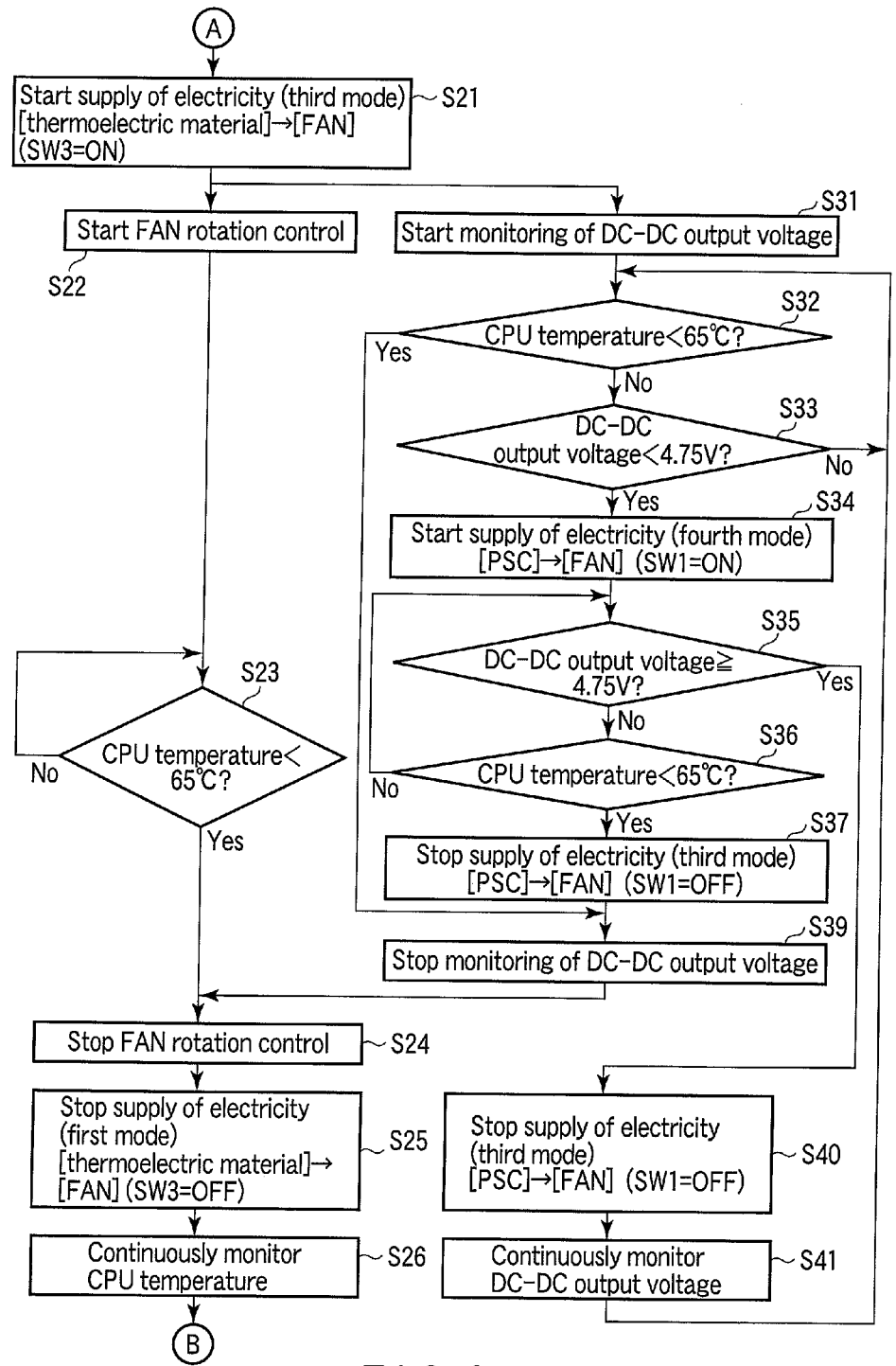
F I G. 9

INFORMATION PROCESSING APPARATUS

CROSS-REFERENCE TO RELATED APPLICATIONS

This application is based upon and claims the benefit of priority from Japanese Patent Application No. 2009-272772, filed Nov. 30, 2009; the entire contents of which are incorporated herein by reference.

FIELD

Embodiments described herein relate generally to an information processing apparatus having a thermoelectric element and cooling means combined to cool an electronic component.

BACKGROUND

A Peltier element is sometimes used to cool an electronic component such as a CPU. It is disclosed in Jpn. Pat. Appln. KOKAI Publication No. 2000-77585 that a Peltier element absorbs thermal energy from an electronic component to generate electricity and drive a cooling fan by use of the electricity. In another embodiment, it is disclosed that the Peltier element also receives electricity from a power source and absorbs heat. Further, in still another embodiment, it is disclosed that electricity generated by the Peltier element and electricity from the power source are supplied to the cooling fan.

In the technique disclosed in the above document, the Peltier element (thermoelectric element) always performs a heat absorption process or a thermoelectric conversion. Since the Peltier element can perform the heat absorption process and thermoelectric conversion and the heat absorption process and thermoelectric conversion can be selectively used, it is desired to develop a method for usefully utilize the thermoelectric element.

Further, if electricity generated by the Peltier element and electricity from the power source are supplied to the cooling fan, electricity from the power source is supplied to the cooling fan even in a case where the cooling fan can be driven only by electricity generated by the Peltier element. Therefore, the driving time of the apparatus becomes short if it is driven by use of a battery. As a result, it is desired to switch a supply source of driving electricity supplied to the cooling fan between the power source and thermoelectric element.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is a block diagram showing the configuration of an information processing apparatus according to one embodiment.

FIG. 4 is an exemplary table showing modes that can be switched by means of an EC/KBC.

FIG. 5 is an exemplary block diagram showing the states of switches SW1 to SW3 shown in FIG. 3 in a second mode.

FIG. 9 is an exemplary flowchart showing the procedure of a control process of switching modes.

DETAILED DESCRIPTION

Figure 2:
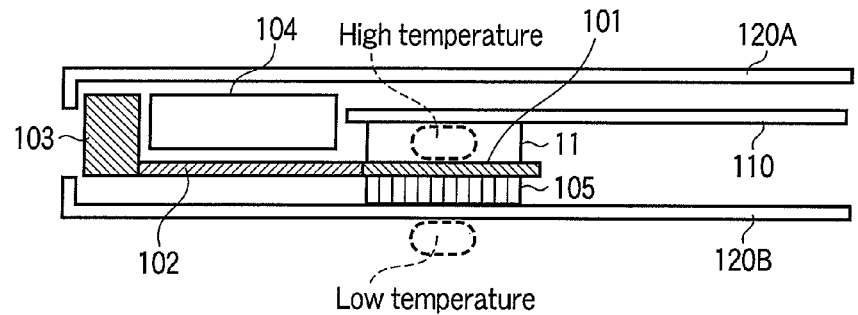
FIG. 2 is a cross-sectional view showing the structure of the information processing apparatus shown in FIG. 1.

Various embodiments will be described hereinafter with reference to the accompanying drawings.

In general, according to one embodiment of the invention, an information processing apparatus includes an electronic component, a cooling module, a thermoelectric element, a first power source, a second power source, a determination module, and a switcher. The cooling module configured to cool the electronic component. The thermoelectric element configured to absorb heat generated by the electronic component when a current is supplied the thermoelectric element, and to generate first electricity by performing a thermoelectric conversion by use of the heat generated by the electronic component when the current is not supplied the thermoelectric element. The first power source configured to generate first driving electricity to drive the cooling module from the first electricity generated by the thermoelectric element when the thermoelectric element performs the thermoelectric conversion. The second power source configured to generate second driving electricity to drive the cooling module by use of second electricity supplied from a supply source which is either a battery or an AC/DC adapter. The determination module configured to determine whether the supply source is the battery. The switcher configured to switch between a first mode and a second mode based on a determination result of the determination module, wherein the thermoelectric element performs the thermoelectric conversion and the cooling module is driven by the first driving electricity in the first mode, and the thermoelectric element absorbs the heat generated by the electronic component and the cooling module is driven by the second driving electricity in the second mode.

FIG. 1 is a block diagram showing the schematic configuration of a personal computer used as an information processing apparatus according to one embodiment.

As shown in FIG. 1, a present computer 10 includes a CPU 11, north bridge 12, main memory 13, graphics processing unit (GPU) 14, display panel 15, south bridge 16, hard disk drive (HDD) 17, network controller 18, BIOS-ROM 19, embedded controller/keyboard controller IC (EC/KBC) 20, power source controller (PSC) 21 and the like.

The CPU 11 is a processor provided to control the operation of the present computer and execute various application programs and an operating system (OS) loaded from the hard disk drive (HDD) 17 to the main memory 13. A temperature sensor is provided inside the CPU 11.

Further, the CPU 11 loads a system basic input output system (BIOS) stored in the BIOS-ROM 19 to the main memory 13 and then executes the same. The system BIOS is a program for hardware control.

The north bridge 12 is a bridge device that connects the local bus of the CPU 11 with the south bridge 16. A memory controller that controls access to the main memory 13 is contained in the north bridge 12. Further, the north bridge 12 has a function of making communication with the GPU 14 via a peripheral component interconnect (PCI) express bus or the like.

The GPU 14 is a display controller that controls the display panel 15 used as a display monitor of the present computer. The GPU 14 includes a video memory (VRAM) and produces a video signal used to form a display image to be displayed on the display panel 15 based on display data drawn in the video memory according to the application program running under the OS. The video signal produced by the GPU 14 is output to the line.

The embedded controller/keyboard controller IC (EC/KBC) 20 functions as a controller that controls a keyboard 22, touch pad 23 and touch pad control button 24 used as input means. The embedded controller/keyboard controller IC 20 is a one-chip microcomputer that monitors and controls various devices (peripheral devices, sensors, power source circuit and the like) irrespective of the system state of the present computer 10. Further, the EC/KBC 20 has a function of acquiring a measurement value of the temperature sensor provided in the CPU 11.

When an external power source voltage is supplied via an AC/DC adapter 21B, the power source controller 21 used as a second power source is a DC-DC power source that supplies system power source voltages to the respective components of the present computer 10 by use of the external power source voltage supplied from the AC/DC adapter 21B. Further, when an external power source voltage is not supplied via the AC/DC adapter 21B, it supplies system power source voltages to the respective components of the present computer 10 by use of a battery 21A.

The network controller 18 is a communication device that makes communication with an external network such as Internet, for example.

Next, the mechanism for cooling the CPU 11 is explained. FIG. 2 is a cross-sectional view showing the structure of a computer according to one embodiment.

As shown in FIG. 2, the computer includes a CPU 11, heat sink 101, heat pipe 102, radiation fins 103, air-cooling fan 104, thermoelectric element 105, base plate 110, casings 120A, 120B and the like.

The CPU 11 is mounted on the base plate 110. The heat sink 101 is provided on the surface of the CPU 11. The heat pipe 102 is connected to the heat sink 101. The radiation fins 103 are connected to the heat pipe 102. The heat sink 101 and heat pipe 102 are provided to transmit heat of the CPU 11 to the radiation fins 103. The air-cooling fan 104 is provided dissipate heat from the radiation fins 103. The CPU 11 is cooled by causing the air-cooling fan 104 to dissipate heat from the radiation fins. The thermoelectric element 105 is provided on the surface of the CPU 11 with the heat sink 101 disposed therebetween. The thermoelectric element 105 is adhered to the surface of the casing 120B. A slit may be formed in a portion of the casing 120B that is adhered to the thermoelectric element 105 to expose the surface of the thermoelectric element 105 that is adhered to the casing 120B side to the outer atmosphere and cool the same. The temperature of the surface of the thermoelectric element 105 that lies on the heat sink 101 side becomes high because of heat generated by the CPU 11. Further, the temperature of the surface of the thermoelectric element 105 that lies on the casing 120B side becomes low because it is adhered to the casing 120B. Therefore, a large temperature difference occurs between the surface of the thermoelectric element 105 that lies on the heat sink 101 side and the surface thereof that lies on the casing 120B side.

The thermoelectric element 105 can mutually convert heat and electricity. The thermoelectric element 105 converts heat from the CPU 11 transmitted via the heat sink 101 to electricity to drive the air-cooling fan 104. Further, heat of the CPU 11 transmitted via the heat sink 101 is absorbed by passing a current through the thermoelectric element 105 to convert electrical energy to thermal energy and the thus absorbed heat is transmitted to the casing 120B side.

Figure 3:
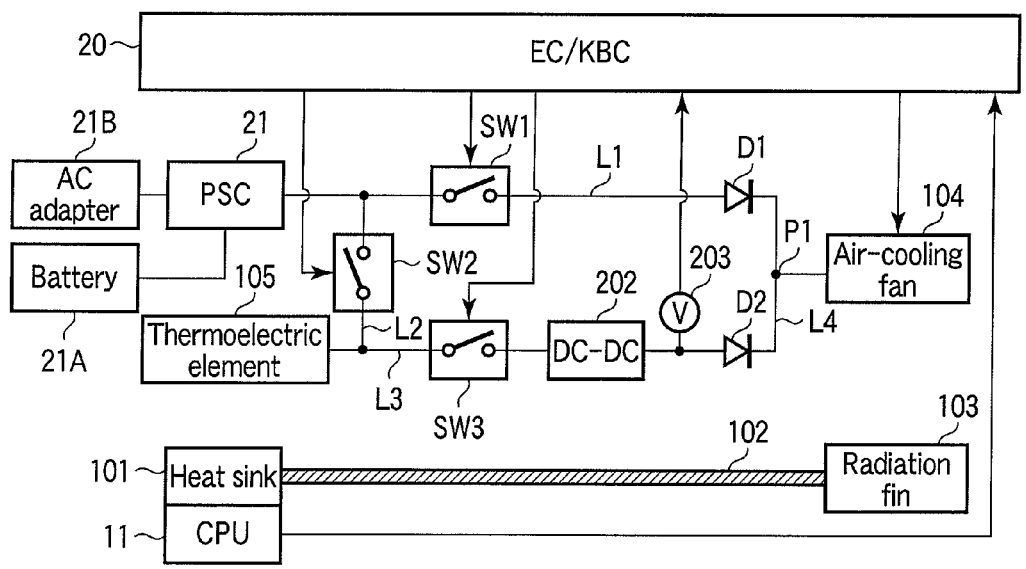
FIG. 3 is an exemplary block diagram showing the configuration of a device that cools a CPU shown in FIG. 1.

Next, the configuration of controlling the cooling process of the CPU 11 by use of the air-cooling fan 104 and thermoelectric element 105 is explained. FIG. 3 is a block diagram showing the configuration of a device that cools the CPU 11 according to one embodiment.

As shown in FIG. 3, the computer is driven by electricity supplied from the battery 21A or AC/DC adapter 21B. The power source controller (PSC) 21 is provided in the succeeding stage of the battery 21A and AC/DC adapter 21B. The power source controller 21 outputs driving electricity to drive the air-cooling fan 104 derived from electricity supplied from the battery 21A or AC/DC adapter 21B. A voltage produced by the power source controller 21 is set to 5.0 V. Further, the power source controller 21 generates a current supplied to the thermoelectric element 105 derived from electricity supplied from the battery 21A or AC/DC adapter 21B.

The air-cooling fan 104 and thermoelectric element 105 are provided in the succeeding stage of the power source controller 21 as a load. A line L1 through which driving electricity supplied from the power source controller 21 to the air-cooling fan 104 is passed is provided between the power source controller 21 and the air-cooling fan 104. A switch SW1 that switches supply/non-supply of driving electricity from the power source controller 21 to the air-cooling fan 104 is inserted in line L1. A diode D1 for preventing reverse flow is inserted in line L1 between a connection node P1 on line L1 and switch SW1. The anode of diode D1 is connected to the power source controller 21 and the cathode of diode D1 is connected to the air-cooling fan 104.

A line L2 through which a current supplied from the power source controller 21 to the thermoelectric element 105 flows is provided between the power source controller 21 and the thermoelectric element 105. A switch SW2 that switches supply/non-supply of a current from the power source controller 21 to the thermoelectric element 105 is inserted in line L2.

The thermoelectric element 105 is also used as a power source by utilizing the property of converting thermal energy to electrical energy. A DC-DC converter 202 used as a first power source to generate a constant voltage based on a desired voltage supplied from the thermoelectric element 105 is provided in the succeeding stage of the thermoelectric element 105. In this case, a voltage generated from the DC-DC converter 202 is basically set to 5.0 V.

A line L3 used to supply electricity generated by the thermoelectric element 105 to the DC-DC converter 202 is provided between the thermoelectric element 105 and the DC-DC converter 202. A switch SW3 that switches supply/non-supply of electricity from the thermoelectric element 105 to the DC-DC converter 202 is inserted in line L3.

A line L4 used to supply driving electricity output from the DC-DC converter 202 to the air-cooling fan 104 is provided between the DC-DC converter 202 and the connection node P1. A voltmeter 203 that measures the voltage of electricity output from the DC-DC converter 202 and a diode D2 are inserted in line L4. The measurement of the voltmeter 203 is supplied to the EC/KBC 20. The anode of diode D2 is connected to the DC-DC converter 202 and the cathode of diode D2 is connected to the air-cooling fan 104.

The cathode of diode D1 is connected to the cathode of the reverse flow prevention diode D2 via line L1, connection node P1 and line L4. In a case where driving electricity can be supplied from both of the power source controller 21 and DC-DC converter 202 to the air-cooling fan 104, one of the two driving electricitys which has a higher voltage is supplied to the air-cooling fan 104.

The on/off states of switches SW1, SW2, SW3 are controlled by means of the EC/KBC 20. Further, the EC/KBC 20 also controls rotation of the air-cooling fan 104, monitors the output voltage of the DC-DC converter 202 and monitors the internal temperature of the CPU 11.

The EC/KBC 20 switches first to fourth modes by controlling the on/off states of switches SW1, SW2, SW3. Next, the first to fourth modes are explained with reference to the table of FIG. 4 and the block diagrams of FIG. 3 and FIG. 5 to FIG. 7.

In FIG. 4, the on/off states of the respective switches in each mode, the driving/non-driving states of the air-cooling fan 104, the utilization method of the thermoelectric element 105 and the type of a supply source (driving electricity source) of driving electricity used to drive the air-cooling fan are shown.

As shown in FIG. 3, the first mode indicates that all of switches SW1, SW2, SW3 are set in the off state. In the first mode, the air-cooling fan 104 is not driven. Therefore, the thermoelectric element 105 is not utilized. In the following second to fourth modes, the air-cooling fan 104 is driven.

As shown in FIG. 5, the second mode indicates that switches SW1, SW2 are set in the on state and switch SW3 is set in the off state. A current is supplied from the power source controller 21 to the thermoelectric element 105 by setting switch SW2 in the on state. As a result, the thermoelectric element 105 absorbs heat generated by the CPU 11 via the heat sink 101. Further, driving electricity is supplied from the power source controller 21 to the air-cooling fan 104 by setting switch SW1 in the on state.

Figure 6:
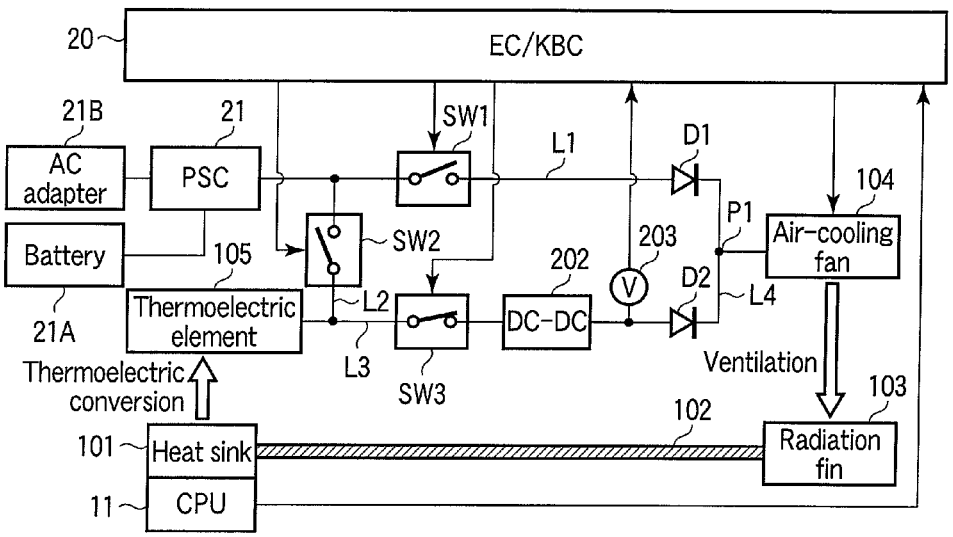
FIG. 6 is an exemplary block diagram showing the states of switches SW1 to SW3 shown in FIG. 3 in a third mode.

As shown in FIG. 6, the third mode indicates that switches SW1, SW2 are set in the off state and switch SW3 is set in the on state. Driving electricity is not supplied from the power source controller 21 to the air-cooling fan 104 since switch SW1 is set in the off state. Further, since switch SW2 is set in the off state, the thermoelectric element 105 performs a thermoelectric conversion without performing a heat absorption process. Then, since switch SW3 is set in the on state, electricity generated by the thermoelectric element 105 is supplied to the DC-DC converter 202. The DC-DC converter 202 outputs driving electricity to drive the air-cooling fan 104 derived from electricity supplied from the thermoelectric element 105 and supplies the thus created driving electricity to the air-cooling fan 104. Further, since switch SW2 is set in the off state, driving electricity is not supplied from the power source controller 21 to the air-cooling fan 104.

Figure 7:
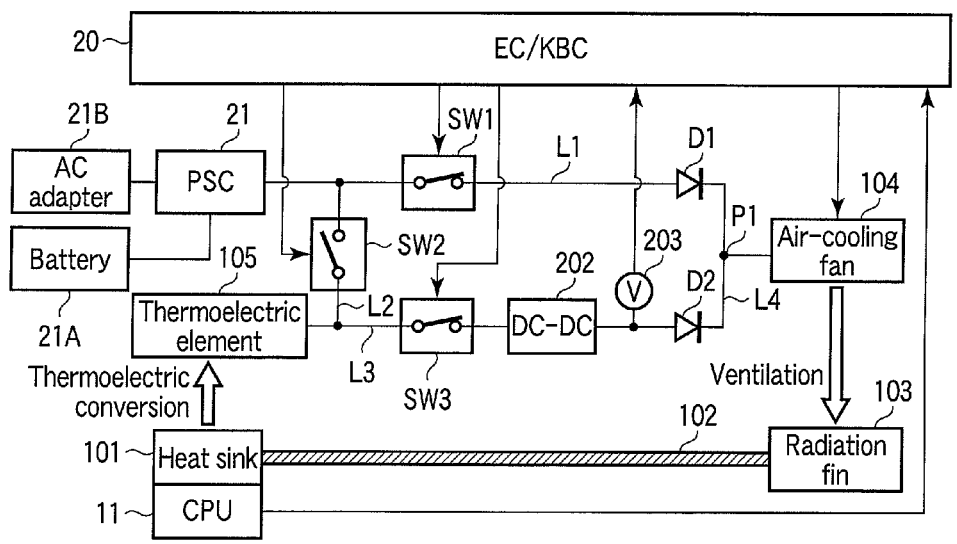
FIG. 7 is an exemplary block diagram showing the states of switches SW1 to SW3 shown in FIG. 3 in a fourth mode.

As shown in FIG. 7, the fourth mode indicates that switches SW1, SW3 are set in the on state and switch SW2 is set in the off state. Since switch SW1 is set in the off state, the state is set in which driving electricity can be supplied from the power source controller 21 to the air-cooling fan 104. Further, since switch SW2 is set in the off state, the thermoelectric element 105 performs a thermoelectric conversion without performing a heat absorption process. Then, since switch SW3 is set in the on state, electricity generated by the thermoelectric element 105 is supplied to the DC-DC converter 202. The DC-DC converter 202 outputs driving electricity to drive the air-cooling fan 104 derived from electricity supplied from the thermoelectric element 105. The state is set in which the thus created driving electricity can be supplied to the air-cooling fan 104. In the fourth mode, since driving electricity with a higher one of potentials that have passed through diodes D1 and D2 is supplied to the air-cooling fan 104, electricity is supplied from the power source controller 21 to the air-cooling fan 104 in a period in which the thermoelectric element 105 cannot supply sufficiently high electricity.

Figure 8:
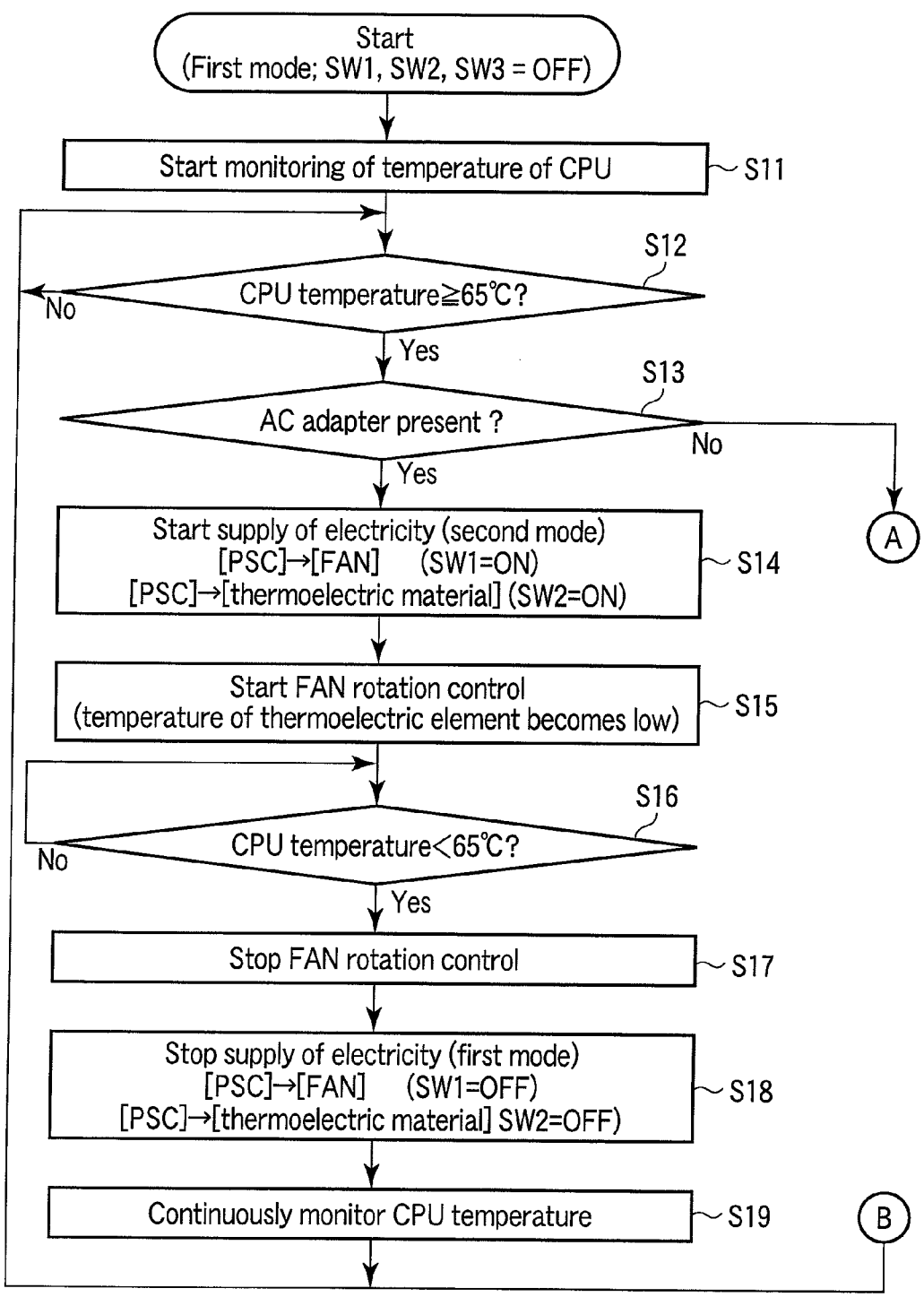
FIG. 8 is an exemplary flowchart showing the procedure of a control process of switching modes.

Next, the procedure of a control process for switching modes is explained with reference to the flowcharts of FIG. 8 and FIG. 9.

Immediately after starting the computer, all of switches SW1, SW2, SW3 are set in the off state under the control of the EC/KBC 20 (first mode) as shown in FIG. 3.

Next, the EC/KBC 20 acquires an internal temperature measured by the temperature sensor provided in the CPU 11 and starts monitoring of the temperature of the CPU 11 based on the thus acquired internal temperature (block S11).

The EC/KBC 20 determines whether or not the acquired internal temperature is greater than or equal to a threshold value (block S12). The threshold value set in block S12 is 65° C. If it is determined that the internal temperature is greater than or equal to 65° C. (Yes in block S12), whether or not the power source controller 21 is driven by electricity supplied by the AC/DC adapter 21B is determined (block S13) in order to check the type of a supply source that supplies electricity to the power source controller 21.

When the power source controller 21 is driven by means of the AC/DC adapter 21B (Yes in block S13), it is unnecessary to pay any attention to saving of the remaining amount of the battery 21A, and therefore, the thermoelectric element 105 is used not as a power source but as a cooling device. In order to use the thermoelectric element 105 as a cooling device, the EC/KBC 20 sets switches SW1, SW2 in the on state and keeps switch SW3 in the off state as shown in FIG. 5 to make switching from the first mode to the second mode (block S14).

If switches SW1 and SW2 are set in the on state, current paths through which currents flowing from the power source controller 21 to the air-cooling fan 104 and thermoelectric element 105 are configured. In this case, an interconnection is made to apply a voltage in a direction to set low the temperature of the surface of the thermoelectric element 105 that makes contact with the radiation fins 103 as shown in FIG. 2.

The EC/KBC 20 starts a rotation control operation of the air-cooling fan 104 (block S15). If the air-cooling fan 104 is rotated and controlled, the air-cooling fan 104 is driven and the temperature of the surface of the thermoelectric element 105 that makes contact with the heat sink 101 becomes low. Generally, the rotation speed of the air-cooling fan 104 varies according to the temperature of the CPU 11 based on the temperature table of the BIOS, but in this example, the explanation thereof is omitted. The temperature of the CPU 11 is gradually reduced by the cooling process.

Next, the EC/KBC 20 determines whether or not the internal temperature of the CPU 11 is less than a threshold value (block S16). The threshold value used at this time is set to the same threshold value of 65° C. used in block S12, but the hysteresis characteristic may be provided and the threshold value may be set to 63° C.

If it is determined that the internal temperature becomes less than 65° C. (Yes in block S16), the EC/KBC 20 stops the driving operation of the air-cooling fan 104 (block S17). Then, the EC/KBC 20 sets switches SW1, SW2 from the on state to the off state as shown in FIG. 3 to make switching from the second mode to the first mode (block S18). Subsequently, the EC/KBC 20 continuously performs a temperature monitoring operation of the CPU 11 (block S19) and returns the process to block S12.

If it is determined in block S13 that the PSC is not driven by the AC/DC adapter 21B (driven by the battery 21A) (No in block S13), the thermoelectric element 105 is not used as a cooling device and is used as a power source. In order to use the thermoelectric element 105 as a power source, the EC/KBC 20 sets switch SW3 to the on state and sets switches SW1, SW2 to the off state as shown in FIG. 6 to make switching from the first mode to the third mode (block S21). As a result, a current path that permits a current to flow from the thermoelectric element 105 to the air-cooling fan 104 is configured. In this case, an interconnection is made to apply a positive voltage (+voltage) with respect to the input side of the power source controller 21 to the thermoelectric element 105.

In the following description, two processes including a process of controlling rotation of the air-cooling fan 104 and a process of monitoring the voltage of electricity output from the DC-DC converter 202 are performed in parallel. First, the process of controlling rotation of the air-cooling fan 104 is explained.

First, the EC/KBC 20 starts the rotation control operation of the air-cooling fan 104 (block S22). The rotation speed of blades of the air-cooling fan 104 varies according to the internal temperature of the CPU 11 based on the temperature table stored in the BIOS-ROM, but the explanation thereof is omitted here.

Then, the EC/KBC 20 determines whether or not the internal temperature of the CPU 11 is less than a threshold value (block S23). In this embodiment, the threshold value is set to the same threshold value of 65° C. used in block S12, but the threshold value may have the hysteresis characteristic with respect to the temperature used in the process of block S12 and the threshold value may be set to 63° C.

If it is determined that the internal temperature of the CPU 11 is less than 65° C. (Yes in block S23), the EC/KBC 20 performs a process starting from block S24. (The process of block S24 will be described later.)

Next, the process of monitoring the voltage of electricity output from the DC-DC converter 202 is explained. First, the EC/KBC 20 starts the process of monitoring an output voltage of the DC-DC converter 202 (block S22). The EC/KBC 20 determines whether or not the internal temperature of the CPU 11 is less than a threshold value (block S32). In this case, the threshold value used in block S32 is set to the temperature that is the same threshold value used in block S23. In this embodiment, the threshold value of 65° C. used in block S23 is set as the threshold value. If it is determined that the internal temperature is not less than the threshold value (No in block S32), the EC/KBC 20 determines whether or not the output voltage of a low-loss regulator is less than 4.75 V (block S33). The driving electricity of the air-cooling fan 104 varies according to the rotation speed of the air-cooling fan 104. When sufficiently high electricity cannot be supplied from the thermoelectric element 105, the output voltage of the DC-DC converter 202 cannot maintain 5.0 V (becomes less than 5.0 V) and electricity required for rotation of the air-cooling fan 104 cannot be compensated for by use of only electricity supplied from the low-loss regulator.

If it is determined that the output voltage of the low-loss regulator is not less than 4.75 V (No in block S33), the process returns to the process of block S32. If it is determined that the output voltage of the low-loss regulator is less than 4.75 V (Yes in block S33), the EC/KBC 20 turns on not only switch SW3 but also switch SW2 as shown in FIG. 7 to make switching from the third mode to the fourth mode (block S34). As a result, a current path that permits a current to flow from the power source controller 20 to the air-cooling fan 104 is configured. As shown in FIG. 6, since electricity is supplied to the air-cooling fan 104 from a portion in which one of potentials after passing through diodes D1 and D2 is set higher, electricity is supplied to the air-cooling fan 104 from the battery 21A in a period in which the thermoelectric element 105 cannot supply sufficiently high electricity.

Then, the EC/KBC 20 determines whether or not the output voltage of the DC-DC converter 202 is greater than or equal to a threshold voltage (block S35). If the temperature difference between the two surfaces of the thermoelectric element 105 becomes larger, for example, and sufficiently high electricity can be supplied again from the thermoelectric element 105, then the output voltage of the DC-DC converter 202 rises and electricity required for driving the air-cooling fan 104 can be compensated for by use of electricity output from the DC-DC converter 202. In this embodiment, the threshold voltage of 4.75 V that is the same as the threshold voltage used in block S33 is used, but the threshold value may have the hysteresis characteristic and the threshold voltage may be set to 5.0 V.

If it is determined that the output voltage of the DC-DC converter 202 is greater than or equal to 4.75 V (Yes in block S35), the EC/KBC 20 turns off switch SW1 as shown in FIG. 6 to interrupt supply of electricity from the power source controller 21 to the air-cooling fan 104 and make switching from the fourth mode to the third mode (block S40). Subsequently, the process of continuously monitoring the voltage of electricity output from the DC-DC converter 202 is performed (block S41).

If it is determined that the output voltage of the DC-DC converter 202 is less than 4.75 V (No in block S35), the EC/KBC 20 determines whether or not the internal temperature of the CPU 11 is less than 65° C. (block S36). If it is determined that the internal temperature is not less than 65° C. (No in block S36), the process returns to the process of block S35.

If it is determined in block S32 or S36 that the internal temperature is less than 65° C. (Yes in block S32, Yes in block S36), the EC/KBC 20 turns off switch SW1 as shown in FIG. 6 to interrupt the supply of electricity from the power source controller 21 to the air-cooling fan 104 and make switching from the fourth mode to the third mode (block S37) since it becomes unnecessary for the air-cooling fan 104 to cool the CPU 11. Subsequently, the EC/KBC 20 stops the process of monitoring the voltage of electricity output from the DC-DC converter 202 (block S39). After the process of monitoring the voltage of electricity output from the DC-DC converter 202 is stopped, the process proceeds to block S24.

If it is determined in block S23 that the internal temperature of the CPU 11 is less than 65° C. (Yes in block S23) and after the process of block S39 is terminated, the EC/KBC 20 stops the process of monitoring the voltage of electricity output from the DC-DC converter 202 (block S39). Then, the EC/KBC 20 stops the rotation control process of the air-cooling fan 104 (block S24). Subsequently, the EC/KBC 20 turns off switch SW3 to set all of switches SW1 to SW3 in the off state as shown in FIG. 3 to make switching from the third mode to the first mode (block S25). Then, the EC/KBC 20 continuously performs a process of monitoring the internal temperature of the CPU 11 (block S26).

According to the present apparatus, the thermoelectric element 105 can be usefully used by making switching between the second mode in which heat generated by the CPU 11 is absorbed by means of the thermoelectric element 105 and the third mode in which electricity generated by the thermoelectric element 105 is used as driving electricity of the air-cooling fan 104 according to the supply source that supplies electricity to the power source control 21.

Further, the supply source of driving electricity supplied to the cooling fan can be switched between the power source and the thermoelectric element by making switching between the third mode in which electricity generated by the thermoelectric element 105 is used as driving electricity of the air-cooling fan 104 and the fourth mode in which one of electricity generated by the thermoelectric element 105 and electricity output from by the power source controller 21 is used as driving electricity of the air-cooling fan 104 according to the output voltage of the DC-DC converter 202. Further, electricity generated by a thermoelectric material can be effectively used as driving electricity of the air-cooling fan even when the voltage is less than a voltage generated by the power source controller 21 by setting the threshold value of switching voltages to be less than the voltage of electricity output by the power source controller 21.

Heat generating electronic components such as the GPU 14 and power MOSFET other than the CPU 11 can be used as objects that supply energy to the thermoelectric element 105 or that are cooled by the thermoelectric element 105 and air-cooling fan 104.

It is possible to prepare means for permitting the user to select a process of continuously performing the cooling process at the driving time of the AC/DC adapter 21B or a process of performing a cooling process at the driving time of the battery 21A in a case where the AC/DC adapter 21B is removed during the cooling process at the driving time of the AC/DC adapter 21B.

It is also possible to prepare means for permitting the user to select a process of continuously performing the cooling process at the driving time of the battery 21A or a process of performing a cooling process at the driving time of the AC/DC adapter 21B in a case where the AC/DC adapter 21B is mounted during the cooling process at the driving time of the battery 21A.

Further, it is possible to prepare means for permitting the user to select the operation performed in the third mode (FIG. 6) or fourth mode (FIG. 7) in which electricity from the thermoelectric element 105 is used as driving electricity of the air-cooling fan 104 in a case where the PSC is driven by the AC/DC adapter 21B from the ecological viewpoint irrespective of removal/mounting of the AC/DC adapter 21B.

In the above embodiment, the air-cooling fan is used as cooling means for cooling the CPU 11, but another cooling mechanism can be used if it is driven by electricity.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing apparatus comprising:
an electronic component;
a cooling module configured to cool the electronic component;
a thermoelectric element configured to absorb heat generated by the electronic component when a current is supplied to the thermoelectric element, and to generate electricity by performing a thermoelectric conversion using the heat generated by the electronic component when the current is not supplied to the thermoelectric element;
a first power source configured to generate first driving electricity to drive the cooling module from the electricity generated by the thermoelectric element when the thermoelectric element performs the thermoelectric conversion;
a second power source configured to generate second driving electricity to drive the cooling module using electricity supplied from a supply source which is either a battery or an alternating current to direct current (AC/DC) adapter;
a determination module configured to determine whether the supply source is the battery or the AC/DC adapter; and
a switching module configured to switch between a first mode and a second mode based on a determination result of the determination module, wherein the thermoelectric element is configured to perform the thermoelectric conversion and the cooling module is driven by the first driving electricity in the first mode, and the thermoelectric element is configured to absorb the heat generated by the electronic component and the cooling module is driven by the second driving electricity in the second mode.

2. The information processing apparatus of claim 1, further comprising a detector configured to detect voltage of the first driving electricity,
wherein the switching module is configured to switch to the first mode when the determination module determines that the supply source is the battery, and
wherein the switching module is configured to switch between the first mode and a third mode based on the voltage detected by the detector after switching to the first mode, the thermoelectric element being configured to perform the thermoelectric conversion and the cooling module being driven by one of the first driving electricity and the second driving electricity in the third mode.

3. The information processing apparatus of claim 2, further comprising:
a first switch configured to switch between supply and non-supply of the second driving electricity from the second power source to the cooling module;
a second switch configured to switch between supply and non-supply of the current to the thermoelectric element; and
a third switch configured to switch between supply and non-supply of the electricity from the thermoelectric element to the first power source,
wherein the switching module is configured to control the first switch, the second switch, and the third switch based on the determination result of the determination module in order to switch between the first mode and the second mode, and to control the first switch, the second switch, and the third switch based on the voltage detected by the detector in order to switch between the first mode and the third mode.

4. The information processing apparatus of claim 1, wherein the switching module is configured to switch between driving and non-driving of the cooling module according to temperature of the electronic component.

5. The information processing apparatus of claim 1, further comprising:
a first switch configured to switch between supply and non-supply of the second driving electricity from the second power source to the cooling module;

a second switch configured to switch between supply and non-supply of the current to the thermoelectric element; and a third switch configured to switch between supply and non-supply of the electricity from the thermoelectric element to the first power source, wherein the switching module is configured to control the first switch, the second switch, and the third switch based on the determination result of the determination module in order to switch between the first mode and the second mode.

* * * * *